United States Patent [19]

Samaras et al.

[11] Patent Number: 5,072,132
[45] Date of Patent: Dec. 10, 1991

[54] VSLI LATCH SYSTEM AND SLIVER PULSE GENERATOR WITH HIGH CORRELATION FACTOR

[75] Inventors: William A. Samaras, Haverhill; David T. Vaughan, Tyngsboro, both of Mass.

[73] Assignee: Digital Equipment Corporation, Maynard, Mass.

[21] Appl. No.: 363,708

[22] Filed: Jun. 9, 1989

[51] Int. Cl.⁵ .................. H03K 3/284; H01L 25/00
[52] U.S. Cl. .................. 307/272.1; 307/480; 307/482.1; 307/303.1; 307/272.2; 307/269
[58] Field of Search .......... 307/480, 482.1, 272.1, 307/272.2, 465.1, 303.1, 303, 269; 357/42, 45, 68

[56] References Cited

U.S. PATENT DOCUMENTS 4,701,860 10/1987 Mader .................. 307/482.1
4,864,161 9/1989 Norman et al. .......... 307/272.2
4,883,980 11/1989 Morimoto et al. ........ 307/482.1

Primary Examiner—Timothy P. Callahan
Attorney, Agent, or Firm—Kenyon & Kenyon

[57] ABSTRACT

A VSLI circuit includes a plurality of state device circuits on a VLSI chip. Each of the state device circuits includes a latch and is clocked by a pulse generator circuit which produces narrow pulses that are coupled to the clock input of the latch. The narrow pulses have a pulse width substantially equivalent to the propagation delay through the latch of the state device circuits. By taking advantage of the high correlative percentages of devices on portions of the chip, master-slave flip flops can be implemented using only a single latch with a pulse generator.

27 Claims, 5 Drawing Sheets

VSLI LATCH SYSTEM AND SLIVER PULSE GENERATOR WITH HIGH CORRELATION FACTOR

FIELD OF THE INVENTION

The invention relates to VLSI circuit design and, more particularly, to the use of simple flow through latches to perform as functional replacements for master-slave flip flops in a VLSI design. Most high speed computers make use of bi-stable elements or state devices, such as latches and flip flops in their design. The type of state devices used in the computer, in conjunction with the synchronous clocking scheme employed for the state devices, determines the speed and efficiency of high speed computers.

BACKGROUND OF THE INVENTION

Synchronous clocking systems are set up such that data flows from one group of state devices to the next, synchronized with the clock. In computer systems, generally, the synchronous clocking is either single phase or multi-phase. The type of clock system chosen for a computer design is based upon the type of state device chosen in the design along with other timing constraints.

The two most common types of state devices used in typical high speed computers include the so-called "flip flop and latch" or "master-slave flip flop." A flip flop is an electronic state device capable of exhibiting either of two stable states and of switching between these states in a reproducible manner. In a logic circuit, the two states are made to correspond to logic 1 and logic 0. Flip flops are therefore one-bit memory elements which are used in digital processors.

Flip flops are available in various forms including "D flip flops" and "master-slave flip flops". A D flip flop is a clocked flip flop having a single input D. The D flip flop output Q takes on the current state of the D input only when a given transition of the clock signal occurs between its two logic states. A master-slave flip flop includes master and slave elements that are clocked on complementary transitions of the clock signal. Data is only transferred from the master element to the slave element, and hence to the output, after the master device outputs have stabilized. Master-slave operation eliminates the possibilities of ambiguous outputs, which can occur in single element flip flops as a result of propogation delays in driving the flip flops.

A latch is a state device that can be considered as an extension of a flip flop, which temporarily stores a single bit of data. The storage is controlled by a clock signal, a given transition of which fixes the latch output at the current value of its input. During the period in which the clock signal is open, data supplied to the input of the latch flows through to the latch output (flow through latch). Generally, master-slave flip flops contain two latches i.e., a master and a slave. These state devices can be described with respect to their various parameters which are defined below and used throughout the specification:

"C" is the cycle time or period for the clock cycle.

"$T_{pd}$" is the propagation delay time through the state device and is defined as the time interval between a change on the device's clock or data input until the corresponding change on the output.

"$T_{su}$" is the "data to clock set up" time for a state device and is defined as the minimum time interval during which the device data input must be held stable before the arrival of the latching edge of the clock pulse.

"$T_{hld}$" is the clock to "data hold time" for a state device and is defined as the minimum time interval during which the device data input must be held stable after the latching edge of the clock pulse has been removed.

"S" is the clock skew defined as the undesired difference between arrival times of the clock signals at any pair of destinations, where the arrival times are expected to be substantially identical.

"W" is the width of the clock pulse, corresponding to the time period in which a latch is held open.

"MIN" or "MINPATH" is the minimum amount of delay necessary to insure a race-free transfer of data between two state devices.

"MAX" or "MAXPATH" is the maximum amount of delay that is allowed between two state devices.

Prior computers have extensively used master-slave flip flops in their VLSI designs. To operate properly on a VLSI chip, however, master-slave flip flops typically require twice as much power and twice as much area as a simple latch.

The use of only one simple latch in place of a master-slave flip flop or state device in a VLSI design has been very difficult to implement due to the timing constraints imposed by the necessary clocking required. There is therefore a need for a simple latch design which functions as a master-slave flip flop replacement while operating properly in conjunction with the synchronous clock system of a high speed computer.

SUMMARY OF THE INVENTION

The present invention makes use of latches which function as master-slave flip flops yet require approximately half of the area and half of the power of a master-slave flip flop for proper operation in a VLSI design. The latch system is synchronously clocked by a pulse generator which produces sliver or narrow pulses to reduce the minimum and maximum amount of delay necessary to approximate the operation of the master-slave flip flop. Further, the pulse generator makes use of the correlation among state devices formed on a VLSI chip to eliminate the problems of regulating the pulse width size. Sliver pulses from a single pulse generator are used to clock the state devices similarly located on the same chip. Overall, a single chip can have multiple sliver pulse generators.

The present invention comprises a first flow-through latch having an input, an output and a clock input.

A pulse generator circuit in the invention produces narrow pulses coupled to the clock input of the first latch wherein the first latch, and the pulse generator are physically spaced in close proximity to each other in a VLSI chip to take advantage of the correlation factor among state devices on the same chip.

It is therefore an advantage of the present invention to provide a correlated sliver latch which functions as a master-slave flip flop. The invention substantially reduces the power requirements for the master-slave flip flop as well as the area requirements needed on the VLSI chip.

It is a further advantage to allow the clock scheme to be distributed at a 50% duty cycle. This is accomplished without any extreme concern with respect to the pulse width.

Further, the correlated sliver latch allows for the distribution of fewer clocks because a single latch behaves as a master-slave flip flop, rather than the usual two latch master slave flip flop.

Also, the present invention allows the clock speed to be increased without any special concern. The faster chips will have narrower sliver clock-widths.

DETAILED DESCRIPTION

Figure 1:
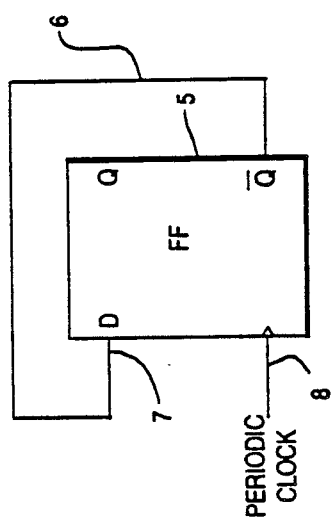
FIG. 1 is a block diagram of a master-slave flip flop.
Figure 1A:
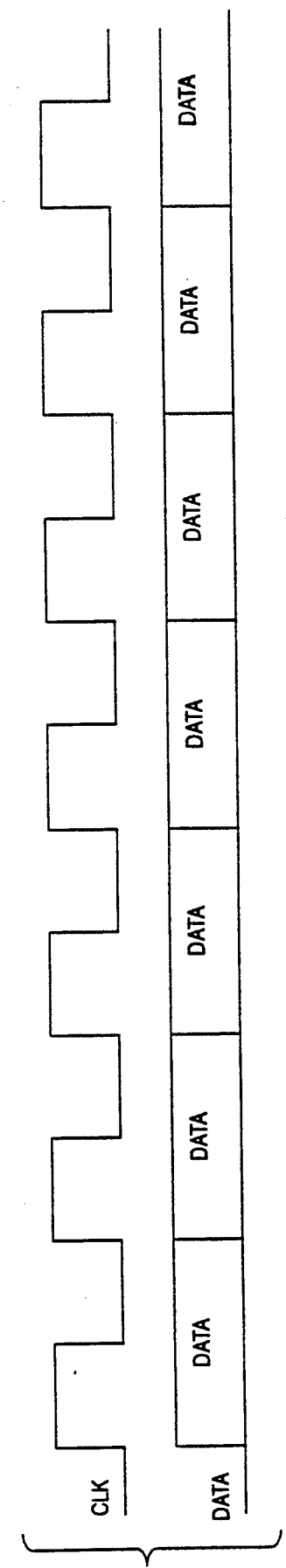
FIG. 1A is a timing chart for FIG. 1.

The operation of master-slave flip flops and latches will be described with reference to FIGS. 1, 1A, 2 and 2A. Master slave flip flops generally contain two latches coupled together in a manner which allows a "race-free" operation between the latches. The output state of the master-slave flip flop changes on only one periodic clock edge. A race-free construction of a master-slave flip flop 5 is shown in FIG. 1 and its operation is described by the timing charts of FIG. 1A. The race-free operation means that the bi-stable element or state device output 6 may be used as the same state device's input 7. The output is a function of the previous state, and the output can therefore change at the arrival of a particular clock event 8, e.g., usually the rising edge of the clock signal. Note that the data changes only when the rising edge of the clock pulse occurs as seen in FIG. 1A.

Figure 2:
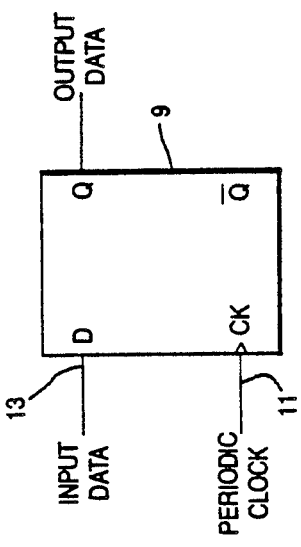
FIG. 2 is a block diagram of a flow through latch used in the present invention.
Figure 2A:
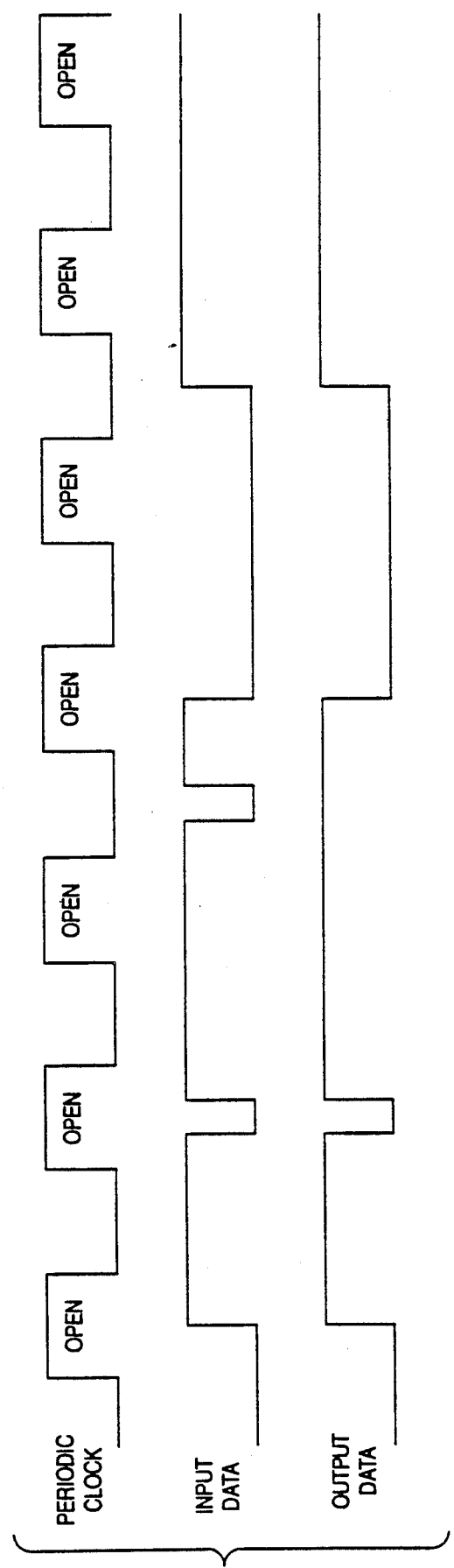
FIG. 2A is a timing chart for FIG. 2.

Referring to FIG. 2, there is shown a simple latch 9 having the characteristic of allowing data 13 to flow through the latch 9 whenever the clock input 11 is in the "open" state. Generally, for a simple transparent latch 9, the latch 9 is held open when the clock signal 11 is high and the data 13 is latched when the clock signal 11 goes low. The operation of the typical flow through latch 9 is shown by the timing chart of FIG. 2A. Note that a simple flow through latch 9 cannot be used to send data 13 back to itself (as in the master-slave flip flop example above), due to the data "racing" during the time period when the clock is held open. In this case, when the clock is open, the data would circulate continuously independent of the clock signal.

Figure 3A:
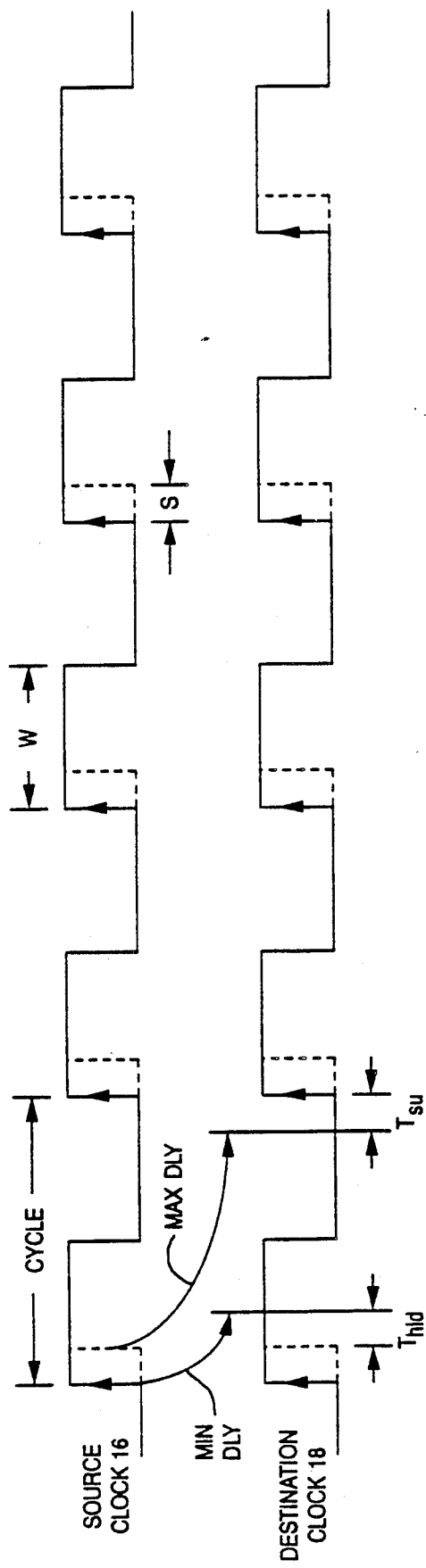
FIG. 3A is a timing chart of the clock signal input to FIG. 3.
Figure 3:
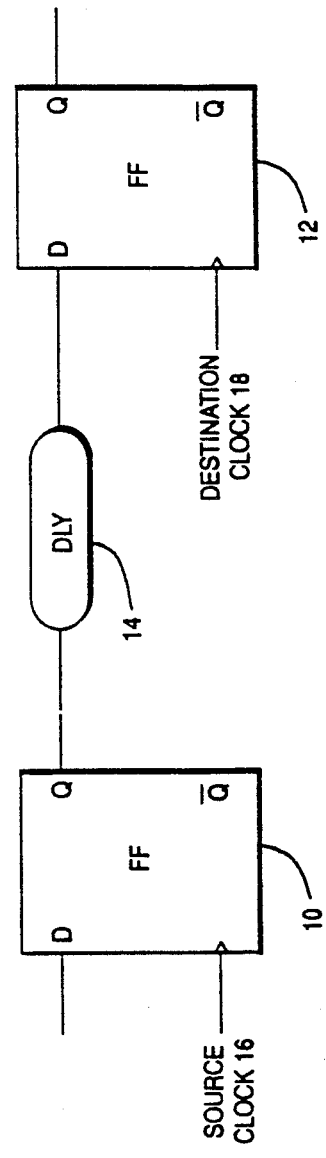
FIG. 3 is a logic diagram showing the clocking between master-slave flip flops.

Referring to FIG. 3, there is shown a logic circuit including two master-slave flip flops 10 and 12 coupled by a delay 14. The Q output of input master-slave flip flop 10 is coupled through the delay 14 to the D input of destination master slave flip flop 12. The arrangement illustrates the clocking of data through two typical master-slave flip flops. The master slave flip flops 10 and 12 further include a source clock input 16 and a destination clock input 18, respectively. The clock inputs 16, 18 are from a single clock source and therefore have an approximately equal timing as shown in the timing chart of FIG. 3.

It can be seen from FIGS. 3 and 3A that the following master-slave flip flop equations can be derived:

$$MIN\ DLY \geq S + T_{hld} - T_{pd}(min) \quad \text{Eq. (1)}$$

$$MAX\ DLY \leq CYCLE - S - T_{su} - T_{pd}(max) \quad \text{Eq. (2)}$$

The required minimum delay MIN DLY necessary to insure a race-free transfer between the two master-slave flip flops 10, 12 is greater than or equal to the clock skew S between the source clock 16 and a destination clock 18 plus the "clock to data hold" time $T_{hld}$ for the destination master-slave flip flop 12 minus the minimum propagation delay Tpd(min) through the master slave flip flop 10 as shown by Eq. (1). The maximum delay MAX DLY allowed between the two master-slave flip flops is less than or equal to the CYCLE time minus the clock skew S minus the "data to clock set up" time $T_{su}$ for the destination master-slave flip flop 12 minus the maximum propagation delay $T_{pd}(max)$ through the flip flop 10 as shown by Eq. (2).

Figure 4A:
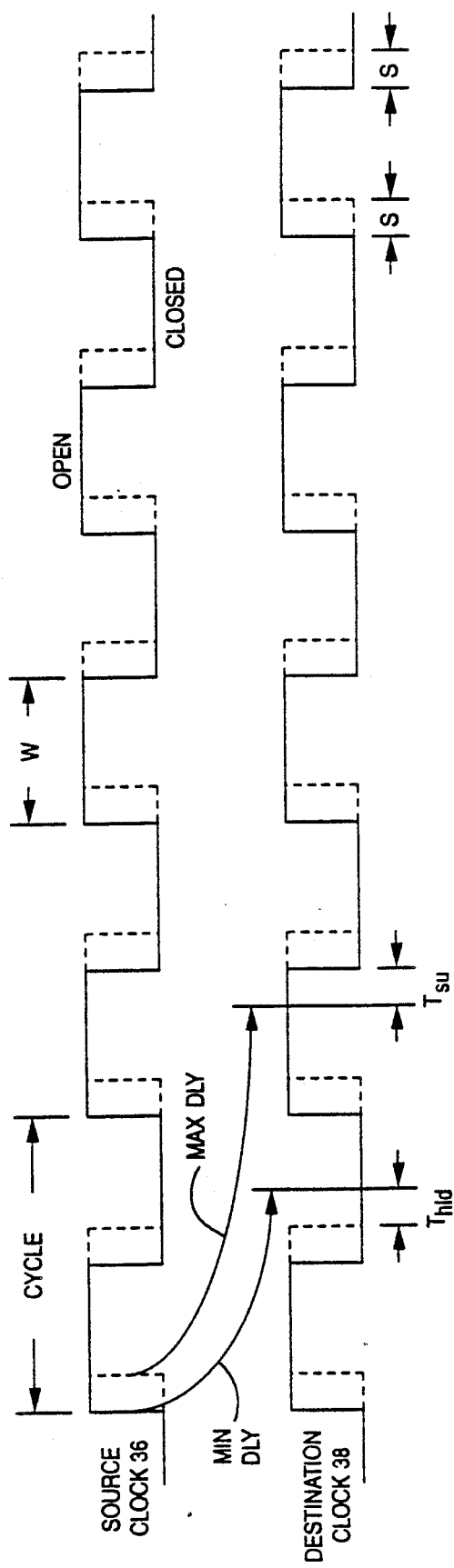
FIG. 4A is a timing chart of the clock signal input to FIG. 4.
Figure 4:
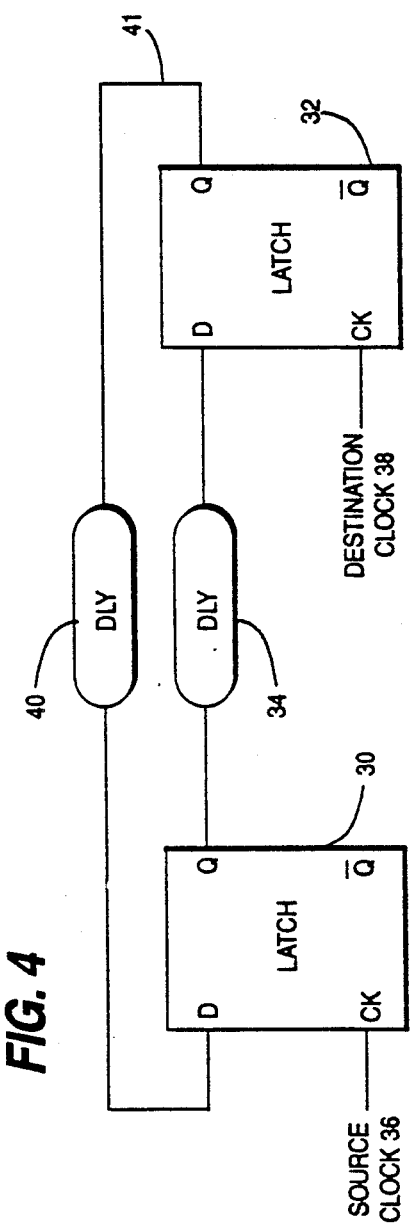
FIG. 4 is a logic diagram showing the clocking between latches functioning as replacements for master-slave flip flops as in the present invention.

Referring to FIG. 4, there is shown flow through latches 30 and 32 coupled together via a delay DLY 34. The Q output of input latch 30 is coupled via the delay 34 to the D input of destination latch 32. Further, the Q output of latch 32 is fed back through delay 40 into the D input of latch 30. Also, a source clock signal 36 and a destination clock signal 38 are fed to the clock inputs of latches 30 and 32, respectively. The timing of the source clock signal 36 and the destination clock signal 38 is shown in FIG. 4A. It is noted that for the flow through latches 30 and 32, the data is latched on the falling edge of the clock signal and the latch is opened on the rising edge of the clock signal. Each of the latches 30, 32 can be made to operate as a master-slave flip flop as will be shown below.

The minimum delay MIN DLY and maximum delay MAX DLY for the latch circuit operation is illustrated in FIG. 4A and described in equations 3 and 4.

$$MIN\ DLY \geq W + S + T_{hld} - T_{pd}(min) \quad \text{Eq. (3)}$$

$$MAX\ DLY \leq CYCLE - S - T_{su} - T_{pd}(max) + W \quad \text{Eq. (4)}$$

The MIN DLY is greater than or equal to the width W of clock pulse corresponding to the time the latch is open, plus the clock skew S plus the "clock to data hold" time $T_{hld}$ for the destination latch 32 minus the minimum propagation delay $T_{pd}(min)$ through the latch 30 as shown by Eq. (3). The MAX DLY is less than or equal to the CYCLE time minus the clock skew S minus the "clock to data set up" time $T_{su}$ for the destination latch 32 minus the maximum L propagation delay $T_{pd}(max)$ through the latch 30 plus the width W of the clock pulse as shown by Eq. (4).

It is seen that as the width W approaches zero, the latch equations 3 and 4 become closer to the master-slave flip flop equations 1 and 2. For W=0, equations 3 and 4 reduce to equations 5 and 6 which are identical to equations 1 and 2.

$$MIN\ DLY \geq S + T_{hld} - T_{pd}(min) \quad \text{Eq. (5)}$$

$$MAX\ DLY \leq CYCLE - S - T_{su} - T_{pd}(max) \quad \text{Eq. (6)}$$

Because of this operation, a simple latch can be used as a master-slave flip flop. In a practical sense, latches typically use only half the power of a master-slave flip flop and consume only half of the area on a VLSI design. An optimum VLSI design would therefore encompass the use of latches having a clocking pulse approaching zero. A practical implementation would expect the sliver width to be at least one order of magnitude less than the cycle time.

Figure 5:
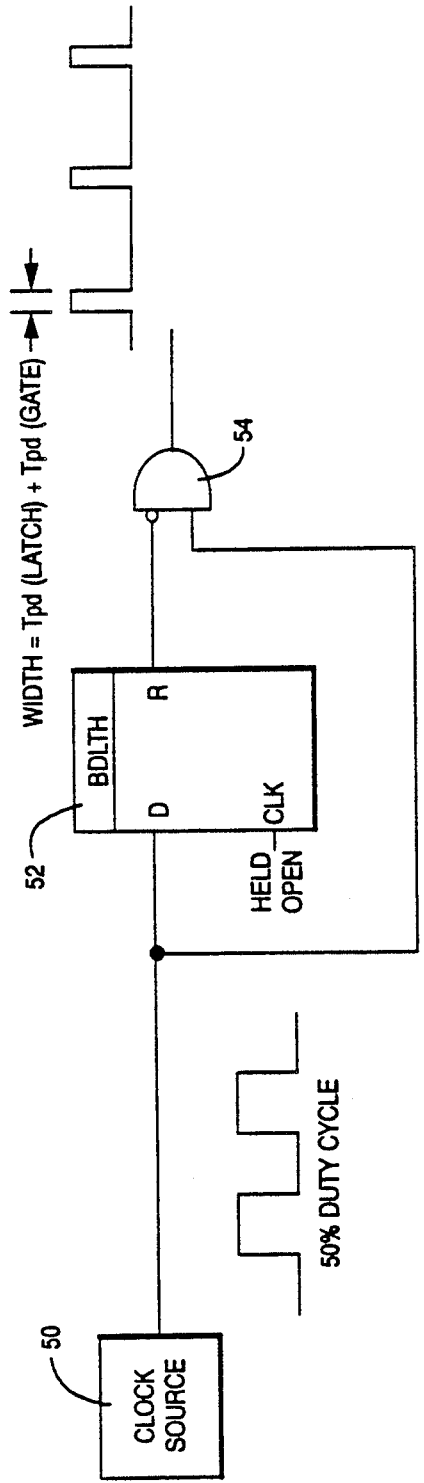
FIG. 5 is an embodiment of a pulse generator used in the present invention.

However, because the pulse width W cannot equal zero, the use of a narrow "sliver" clocking pulse can be generated. FIG. 5 shows a simple embodiment of a logic circuit for generating sliver pulses. A clock source 50 is coupled to the inputs of AND gate 54. A delay 52 is introduced between the clock source 50 and one input of the AND gate 54. This delay 52 can be a latch 52 having its clock input held open. The example of FIG. 5 uses a 50% duty cycle from clock source 50 to the inputs of AND gate 54. Due to the delay, $T_{pd}$ (latch), introduced by the latch 52, a narrow sliver pulse having a width equalling $T_{pd}$(latch) plus $T_{pd}$(gate) is generated as shown in FIG. 5A. The width of this sliver pulse can be made as narrow as physically possible. However, it is physically difficult to propagate such a narrow pulse in a VLSI design. The actual implementation should attempt to match the sliver width to the latch propagation delay $T_{pd}$.

The present invention utilizes the correlation factor with respect to circuit parameters on VLSI chips. Correlation is defined as how well two or more circuit parameters track each other. It is a measure of a tendency for two or more random variables to be associated. For example, if the two delays of two different state devices correlate 100%, then their respective delays would be identical. If the delays have 0% correlation, then there is no relationship whatsoever between them. The correlation factor takes into account the fact that the properties, e.g., $T_{pd}$(min and max), power consumption, etc. of state devices similarly situated on a VLSI chip correspond closely with other state devices spaced nearby. This correlation is due to several factors, e.g. similar processing of the chip and the similar nature of the material, i.e., the silicon parameters of areas on the chip do not vary much with those areas in close spatial proximity.

The correlative properties are taken advantage of by creating pulse generators on the VLSI design using state devices which are nearby the state devices to be clocked. Because of this, sliver pulses can be generated which have a width substantially identical to the propagation delay $T_{pd}$ of closely spaced state devices.

The pulse generator shown in FIG. 5 creates sliver widths W substantially equivalent to the propagation delay through the latch 52. Therefore, as a worst case example, substituting W=$T_{pd}$ into equation 3 and setting W equal to zero in equation 2 results in the following equations 7 and 8:

$$MIN\ DLY \geq T_{hld} + S \qquad \text{Eq. (7)}$$

$$MAX\ DLY \leq CYCLE - S - T_{su} - T_{pd}(max) \qquad \text{Eq. (8)}$$

These equations assume that the sliver width W correlates to the propagation delay of the state device thus guaranteeing that the sliver pulse cannot be too narrow to propagate through the clocked state device. The sliver width is therefore always wide enough to guarantee a predictable MIN PATH.

Figure 6:
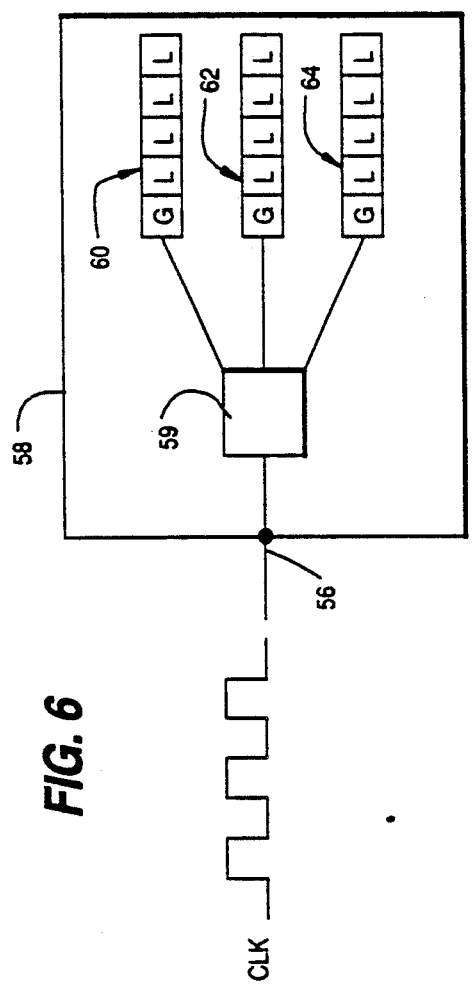
FIG. 6 is a block diagram of the present invention showing multiple pulse generators on a VLSI chip.

FIG. 6 shows an example of how the correlated sliver latches can be implemented on a VLSI design chip 58. The chip 58 includes blocks 60, 62 and 64 of physically similar latches L on the chip 58. Further, each block 60, 62, and 64 includes a pulse or sliver generator G formed by using one of the latches L. A clock signal CLK is input to the chip 58 at pin 56 and propagates to a distribution stage 59. The distribution stage 59 splits the clock signal into several signals and propagates each clock signal to one of the blocks 60, 62, and 64. At each block, the sliver generator G generates the narrow sliver pulses to operate the latches L in each of the blocks.

A comparison of the savings obtained using sliver latches in lieu of master-slave flip flops is given below with respect to the examples assuming a master-slave flip flop consumes two units of power and occupies two units of area; and a latch consumes one unit of power and occupies one unit of area; a sliver generator consumes one unit of power and occupies one unit of area. It is possible that sliver latches be grouped in clusters of four, six or eight, with each cluster containing a single pulse generator. It is noted, however, that the actual group size is an arbitrary figure.

It is therefore seen that a cluster of four latches and one sliver generator can produce four master-slave flip flops while consuming only five units of area, i.e., five "cells". On the other hand, because each master-slave flip flop requires two latches thus consuming two units of area, a pure master-slave flip flop design requires eight units of area to produce four master-slave flip flops. Therefore, there is a fractional reduction of "3/8ths" in the number of cells saved using a sliver latch design.

EXAMPLE 1

If the total number of flip flop cells are known in a design (the total number of master-slave flip flop cells equals the total number of master-slave flip flops times two), then the total reduction in master-slave flip flop cells gained through the use of sliver latches can be determined. Assuming sliver latches are in clusters of four, the savings in area over a pure flip flop design is equal to:

Savings in cells=0.375 (# of master-slave flip flop cells)      Eq. (9)

If there are 1,000 master-slave flip flops in a design, then there are a total of 2,000 master-slave flip flop cells. Inserting the numbers into Eq. 9 shows a saving of 750 cells.

EXAMPLE 2

Assuming all sliver latches are now grouped in clusters of eight, the fractional savings over a pure master-slave flip flop design is equivalent to "7/16ths". If there are 1,000 master-slave flip flops in design, then there are 2,000 master-slave flip flop cells. Inserting the number into Eq. (10) below results in a savings of 876 cells.

Savings in cells=0.4375 (# of master-slave flip flop cells)      Eq. (10)

EXAMPLE 3

Assuming a particular VLSI design having a total usable area of 3,000 cells, but with only 700 master-slave flip flops, then the power and cell savings achieved by using sliver latches can be determined. The sliver latches are assumed to be available in clusters of four only.

Because there are 700 master-slave flip flops, then there are 1,400 cells allocated to the state devices. The number of cells used by the sliver latches is computed as follows:

$$(1,400 \text{ cells}) \times (1 - 0.375) = 875 \text{ cells}.$$

The cells savings can then be computed as follows:

```
  3000 Total cells
- 1400 master-slave Flip flop cells
  1600 Non-state device cells 1600 Non-state device cells
+  875 Sliver cells
  2475 Total cells with sliver latches 3000 Total cells
- 2475 Total cells with sliver latches
   525 cells saved
```

The power saved can then be computed by determining the "cells saved ratio", since both the cell area and power proportions are the same. The total power savings is thus given by the equation:

$$1 - \frac{3000 - 525}{3000} \times 100 = 17.5\% \text{ Power Savings}$$

What is claimed is:

1. A state device circuit, comprising:
   a) a flow-through latch circuit having input means, output means, and clock input means; and
   b) a pulse generator circuit for generating narrowed pulses, based on a correlative factor of components of the pulse generator circuit and components of the flow-through latch circuit, for input to the clock input means of the latch circuit, the narrowed pulses having a pulse width substantially equivalent to the propagation delay time through the latch circuit.

2. The state-device circuit according to claim 1 wherein the latch circuit and pulse generator are proximately placed on a chip to provide a very high correlation percentage for predetermined properties of said latch and said pulse generator.

3. The state-device circuit according to claim 1 wherein the latch circuit is operated in a single phase clocking system.

4. The state-device circuit according to claim 2 wherein the latch circuit is operated in a single phase clocking system.

5. The state-device circuit according to claim 1, wherein the pulse generator circuit further comprises:
   a) a clock source; and
   b) a delay circuit coupled to the clock source, with the delay circuit having a propagation delay time substantially equivalent to the propagation delay time of the latch circuit so the narrowed pulses are generated such that the state device circuit operates in a race-free manner.

6. The state-device circuit according to claim 4, wherein the flow-through latch circuit comprises a first and a second flow-through latch coupled via an intermediate delay, with each of the first and second flow through latches receiving narrowed pulses from the pulse generator.

7. A VLSI circuit, comprising a plurality of state device circuits on a VLSI chip, with each of the state device circuits including,
   a) a flow-through latch circuit having input means, output means, and a clock input means; and
   b) at least one pulse generator circuit for generating narrowed pulses, based on a correlative factor of components of the pulse generator circuit and components of the flow-through latch circuit of the plurality of state device circuits, for input to the clock input means of the latch circuit, the narrowed pulses having a pulse width substantially equivalent to the propagation delay through the latch circuits of the solid state circuits, the pulse generator circuit further comprising,
      i. a delay circuit having a high correlation percentage with said correlative factor to components of at least the latch circuits of the plurality of state device circuits on the chip and
      ii. a clock source coupled to the delay circuit.

8. The VLSI circuit according to claim 7, wherein the plurality of state device circuits includes four state device circuits.

9. The VLSI circuit according to claim 7, wherein the plurality of state device circuits includes six state device circuits.

10. The VLSI circuit according to claim 7, wherein the plurality of state device circuits includes eight state device circuits.

11. The VLSI circuit according to claim 7, wherein the latch circuit further comprises a first and a second latch coupled via an intermediate delay, with the two latches receiving narrowed pulses from the pulse generator circuit.

12. A method for operating a plurality of latches having an input, an output and a clock source input as functional replacements for master-slave flip flops on a VLSI chip used in a computer, the method comprising:
   a) locating a set of the plurality of latches in close proximity to each other on the chip,
   b) producing narrow pulses from a plurality of pulse generators, the narrow pulses having a pulse width substantially equivalent to the delay through one of the plurality of latches in the set,
   c) locating the plurality of pulse generators in close proximity to the set,
   d) coupling the narrow pulses to the clock inputs of the set of latches wherein each of the latches in the set operates in a race free manner.

13. The method according to claim 12 wherein the step of locating further comprises selecting the set of latches and said plurality of pulse generators based on a correlation factor such that the set of latches and the pulse generators have a high correlation of operating parameters.

14. The method according to claim 13 wherein the step of producing narrow pulses from a plurality of pulse generators further comprises:
   a) generating a delay utilizing a delay device on a VLSI chip having a high correlation with the set of latches;
   b) coupling a clock source to the delay device wherein the produced narrow pulses have a pulse width substantially equivalent to the delay.

15. The method according to claim 14 wherein the step of generating a delay comprises the step of selecting one of the plurality of latches in a set for one of the plurality of pulse generators.

16. A state device circuit, comprising:
 a) at least one flow-through latch circuit having input means, output means coupled to the input means, and clock input means for initiating propagation of signals from the input means to the output means;
 b) at least one pulse generator circuit for generating pulses substantially narrower than pulses of a source clock signal input to the pulse generator circuit, with the narrower pulses having a width substantially equal to the propagation delay of the latch circuit, the narrower pulses being of sufficient width for propagating signals through the latch circuit considering a correlative relationship between the latch circuit and the pulse generator circuit.

17. The state device circuit according claim 16, wherein the latch circuit and the pulse generator circuit are proximally disposed on a VLSI chip.

18. The state device circuit according claim 16, wherein the latch circuit is clocked according to a single phase clocking system.

19. A VLSI circuit, comprising:
 a plurality of state device circuits with each state device circuit having,
 a) at least one flow-through latch circuit having input means, output means coupled to the input means, and clock input means for initiating propagation of signals from the input means to the output means;
 b) at least one pulse generator circuit with means connected to the clock input means of each of the latch circuits of this plurality of state device circuits, with the pulse generator circuit generating pulses substantially narrower than pulses of a source clock signal input to the pulse generator circuit, the narrower pulses having a width substantially equal to the propagation delay of the respective latch circuits, the narrower pulses being of sufficient width for propagating signals through the respective latch circuits considering a correlative relationship between each of the latch circuits and the pulse generator circuit.

20. The VLSI circuit according claim 19, wherein the latch circuits and the pulse generator circuit are proximally disposed on the VLSI chip.

21. The VLSI circuit according claim 19, wherein the latch circuits are clocked according to a single phase clocking system.

22. A VLSI circuit, comprising:
at least four state device circuits on a VLSI chip, with each state device circuit including,
 a) a flow-through latch circuit having input means, output means, and clock input means for initiating propagation of signals from the input means to the output means; and
 b) at least one pulse generator circuit for generating narrowed pulses, based on a correlative factor of components of the pulse generator circuit and components of the flow-through latch circuit, for input to the clock input of the latch circuit, the narrowed pulses having a pulse width substantially equivalent to the propagation delay through the latch circuits of the state device circuits, the pulse generator circuit further comprising,
  i. a delay circuit having a high correlation percentage to the latch circuits of the plurality of state device circuits on the chip, and
  ii. a clock source coupled to the delay circuit.

23. A VLSI circuit, comprising:
at least six state device circuits on a VLSI chip, with each state device circuit including,
 a) a flow-through latch circuit having an input means, output means, and clock input means for initiating propagation of signals from the input means to the output means; and
 b) at least one pulse generator circuit for generating narrowed pulses, based on a correlative factor of components of the pulse generator circuit and components of the flow-through latch circuit, for input to the clock input of the latch circuit, the narrowed pulses having a pulse width substantially equivalent to the propagation delay through the latch circuits of the state device circuits, the pulse generator circuit further comprising,
  i. a delay circuit having a high correlation percentage to the latch circuits of the plurality of state device circuits on the chip, and
  ii. a clock source coupled to the delay circuits.

24. A VLSI circuit, comprising:
at least eight state device circuits on a VLSI chip, with each state device circuit including,
 a) a flow-through latch circuit having input means, output means, and clock input means for initiating propagation of signals from the input means to the output means; and
 b) at least one pulse generator circuit for generating narrowed pulses, based on a correlative factor of components of the pulse generator circuit and components of the flow-through latch circuit, for input to the clock input of the latch circuit, the narrowed pulses having a pulse width substantially equivalent to the propagation delay through the latch circuits of the state device circuits, the pulse generator circuit further comprising,
  i. a delay circuit having a high correlation percentage to the latch circuits of the plurality of state device circuits on the chip, and
  ii. a clock source coupled to the delay circuit.

25. A VLSI circuit, comprising:
at least N state device circuits on a VLSI chip, with each state device circuit including,
 a) a flow-through latch circuit having input means, output means, and clock input means for initiating propagation of signals from the input means to the output means, with N being an even number greater than 8; and
 b) at least one pulse generator circuit for generating narrowed pulses, based on a correlative factor of components of the pulse generator circuit and components of the flow-through latch circuit, for input to the clock input of the latch circuit, the narrowed pulses having a pulse width substantially equivalent to the propagation delay through the latch circuits of the state device circuits, the pulse generator circuit further comprising,
  i. a delay circuit having a high correlation percentage to the latch circuits of the plurality of state device circuits on the chip, and
  ii. a clock source coupled to the delay circuit.

26. A state device circuit, comprising:
 a) at least one pulse generator circuit for generating narrowed pulses, based on a correlative relationship among components of the pulse generator circuit and components of a first and second flow-through latch, for input to clock inputs of the first and second flow-through latches; and b) at least the first and second flow-through latches, with such latches being coupled by an intermediate delay, with each flow-through latch having an input, an output, and a clock input for initiating propagation of signals from the input to the output, with minimum and maximum signal propagation delay through the state device circuit being determined by the expressions:

$$MIN\ DLY \geq T_{hld} + S$$

where $T_{hld}$ = The clock to data hold time for the second latch, this is the minimum time interval during which the second latch data input must be held stable after the latching edge of the clock pulse is removed S = The clock skew—this is the undesired difference between the arrival times of the clock signals at the two latches when such arrival times are expected to be the same $$MAX\ DLY \leq CYCLE - S - T_{su} - T_{pd}(max)$$

where

CYCLE = The clock cycle time

S = The clock skew—this is the undesired difference between the arrival times of the clock signals at the two latches when such arrival times are expected to be the same $T_{su}$ = The data clock set up time for the second latch, this is the minimum time interval during which the second latch data input must be held stable before the arrival of the latching edge of the clock pulse $T_{pd}$ = The maximum propagation delay time through the first latch, this is the time interval between a change in the first latch's clock or data input until the corresponding change on the output.

27. A VLSI circuit, comprising:
N state device circuits that further include,
a) at least one pulse generator circuit on a VLSI chip for generating narrowed pulses, based on a correlative relationship among components of the pulse generator circuit and components of a first and second flow-through latch, for input to clock inputs of the first and second latch of each of N state devices, with N being an even number greater than 2; and b) at least the first and second flow-through latches for each of the N state device circuits, with such latches being coupled by an intermediate delay and each flow-through latch having an input, an output, and a clock input for initiating propagation of signals from the input to the output, with minimum and maximum signal propagation delay through each of the N state device circuits being determined by the expressions:

$$MIN\ DLY \geq T_{hld} + S$$

where $T_{hld}$ = The clock to data hold time for the second latch, this is the minimum time interval during which the second latch data input must be held stable after the latching edge of the clock pulse is removed S = The clock skew—this is the undesired difference between the arrival times of the clock signals at the two latches when such arrival times are expected to be the same $$MAX\ DLY \leq CYCLE - S - T_{su} - T_{pd}(max)$$

where,

CYCLE = The clock cycle time

S = The clock skew—this is the undesired difference between the arrival times of the clock signals at the two latches when such arrival times are expected to be the same $T_{su}$ = The data clock set up time for the second latch, this is the minimum time interval during which the second latch data input must be held stable before the arrival of the latching edge of the clock pulse $T_{pd}$ = The maximum propagation delay time through the first latch, this is the time interval between a change in the first latch's clock or data input until the corresponding change on the output.

* * * * *